US012687579B2

(12) United States Patent
Valsan et al.

(10) Patent No.: US 12,687,579 B2
(45) Date of Patent: Jul. 21, 2026

(54) METHOD AND SYSTEM FOR DETECTING STATOR INTER-TURN FAULT IN INDUCTION MACHINES

(71) Applicant: ABB Schweiz AG, Baden (CH)

(72) Inventors: Simi Valsan, Ernakulam (IN); Ranjeet Kumar, Patna (IN); Arinjai Gupta, Bengaluru (IN)

(73) Assignee: ABB Schweiz AG, Baden (CH)

( * ) Notice: Subject to any disclaimer, the term of this patent is extended or adjusted under 35 U.S.C. 154(b) by 245 days.

(21) Appl. No.: 18/417,283

(22) Filed: Jan. 19, 2024

(65) Prior Publication Data

US 2024/0248137 A1    Jul. 25, 2024

(30) Foreign Application Priority Data

Jan. 22, 2023    (IN) .............................. 202341004310

(51) Int. Cl.
G01R 31/34 (2020.01)

(52) U.S. Cl.
CPC .................................. G01R 31/343 (2013.01)

(58) Field of Classification Search
None
See application file for complete search history.

(56) References Cited

U.S. PATENT DOCUMENTS

| | | |
|---|---|---|
| 4,494,163 A | 1/1985 | Yelland et al. |
| 4,743,115 A | 5/1988 | Arditty et al. |
| 7,592,772 B2 | 9/2009 | Nandi et al. |
| 8,354,817 B2 | 1/2013 | Yeh et al. |
| 8,441,264 B2 | 5/2013 | Wang et al. |
| 8,471,589 B2 | 6/2013 | Zhang et al. |
| 8,635,034 B2 | 1/2014 | Banerjee et al. |
| 8,823,307 B2 | 9/2014 | Gajic et al. |
| 8,903,664 B2 | 12/2014 | Desabhatla |
| 9,255,837 B2 | 2/2016 | Rodriguez |
| 9,383,413 B2 | 7/2016 | Concepcion |
| 9,389,276 B2 | 7/2016 | Nandi et al. |
| 9,413,163 B2 | 8/2016 | Fedigan et al. |
| 9,459,320 B2 | 10/2016 | Viswanathan et al. |
| 9,823,309 B2 | 11/2017 | Mehringer |
| 10,088,506 B2 | 10/2018 | Rodriguez et al. |
| 10,122,307 B2 | 11/2018 | Gieras |
| 10,310,017 B2 | 6/2019 | Som et al. |

(Continued)

FOREIGN PATENT DOCUMENTS

| | | |
|---|---|---|
| BY | 18771 C1 | 12/2014 |
| BY | 20042 C1 | 4/2016 |

(Continued)

*Primary Examiner* — Jermele M Hollington
(74) *Attorney, Agent, or Firm* — Fitch Even Tabin & Flannery LLP

(57)    ABSTRACT

A system and method for detecting stator inter-turn fault in induction machines includes receiving a time series data of a stator current using a plurality of current sensors connected to a stator of the induction machine, determining first and second signature time series data of stator current using fundamental components and harmonic components of the stator current, determining first and second scaled signatures using an Unbalance Factor, determining a discrimination factor, and detecting a stator inter-turn fault when the discrimination factor is greater than a predetermined stator inter-turn fault threshold value.

20 Claims, 7 Drawing Sheets

(56) References Cited

U.S. PATENT DOCUMENTS

| | | | | |
|---|---|---|---|---|
| 10,461,537 B2* | 10/2019 | Cabaussel | | H02P 23/26 |
| 10,598,732 B2 | 3/2020 | Sarwar et al. | | |
| 10,725,107 B2 | 7/2020 | Nadarajan et al. | | |
| 10,838,007 B2 | 11/2020 | Pani et al. | | |
| 10,877,098 B2 | 12/2020 | Rodriguez et al. | | |
| 11,114,911 B2 | 9/2021 | Li et al. | | |
| 11,131,719 B2 | 9/2021 | Armschat et al. | | |
| 11,316,455 B2 | 4/2022 | Alla et al. | | |
| 11,411,521 B2* | 8/2022 | Zhou | | G01R 31/343 |
| 11,656,280 B2* | 5/2023 | Valsan | | H02H 5/10 |
| | | | | 324/765.01 |
| 2016/0266208 A1* | 9/2016 | Athikessavan | | G01R 31/346 |
| 2018/0321321 A1 | 11/2018 | Rodriguez et al. | | |
| 2021/0072320 A1* | 3/2021 | Valsan | | H02H 7/08 |
| 2021/0074475 A1 | 3/2021 | Song et al. | | |
| 2021/0175836 A1 | 6/2021 | Popek et al. | | |
| 2021/0262474 A1 | 8/2021 | Yu et al. | | |
| 2021/0311122 A1 | 10/2021 | Zhang et al. | | |
| 2022/0137138 A1 | 5/2022 | Gu | | |
| 2024/0126251 A1* | 4/2024 | Wang | | G01R 31/343 |

FOREIGN PATENT DOCUMENTS

| | | | |
|---|---|---|---|
| CN | 2558152 Y | 6/2003 |
| CN | 2611914 Y | 4/2004 |
| CN | 1548976 A | 11/2004 |
| CN | 1181355 C | 12/2004 |
| CN | 101017191 A | 8/2007 |
| CN | 101025434 A | 8/2007 |
| CN | 101101319 A | 1/2008 |
| CN | 201000476 Y | 1/2008 |
| CN | 201035110 Y | 3/2008 |
| CN | 201051448 Y | 4/2008 |
| CN | 201133925 Y | 10/2008 |
| CN | 100462729 C | 2/2009 |
| CN | 201336166 Y | 10/2009 |
| CN | 100561246 A | 11/2009 |
| CN | 101592711 A | 12/2009 |
| CN | 201429671 Y | 3/2010 |
| CN | 101071151 B | 4/2010 |
| CN | 101710162 A | 5/2010 |
| CN | 201449435 U | 5/2010 |
| CN | 201477191 U | 5/2010 |
| CN | 201522543 U | 7/2010 |
| CN | 101221206 B | 8/2010 |
| CN | 101819256 A | 9/2010 |
| CN | 101860096 A | 10/2010 |
| CN | 101860136 A | 10/2010 |
| CN | 101162835 B | 11/2010 |
| CN | 101893673 A | 11/2010 |
| CN | 101419266 B | 3/2011 |
| CN | 101988945 A | 3/2011 |
| CN | 101505051 B | 4/2011 |
| CN | 101651329 B | 4/2011 |
| CN | 201819974 U | 5/2011 |
| CN | 101694508 B | 8/2011 |
| CN | 201918859 U | 8/2011 |
| CN | 101592698 B | 10/2011 |
| CN | 102246054 A | 11/2011 |
| CN | 202057745 U | 11/2011 |
| CN | 102290930 A | 12/2011 |
| CN | 101672894 B | 1/2012 |
| CN | 101794984 B | 5/2012 |
| CN | 102510183 A | 6/2012 |
| CN | 102520352 A | 6/2012 |
| CN | 101453147 B | 7/2012 |
| CN | 101741307 B | 7/2012 |
| CN | 102590699 A | 7/2012 |
| CN | 202351377 U | 7/2012 |
| CN | 102636751 A | 8/2012 |
| CN | 202421391 U | 9/2012 |
| CN | 102721903 A | 10/2012 |
| CN | 102809727 A | 12/2012 |
| CN | 102087328 B | 1/2013 |
| CN | 202720302 U | 2/2013 |
| CN | 202735463 U | 2/2013 |
| CN | 102135585 B | 4/2013 |
| CN | 103063974 A | 4/2013 |
| CN | 202873108 U | 4/2013 |
| CN | 102044862 B | 5/2013 |
| CN | 102087329 B | 5/2013 |
| CN | 103116109 A | 5/2013 |
| CN | 103117170 A | 5/2013 |
| CN | 202918087 U | 5/2013 |
| CN | 202975248 U | 6/2013 |
| CN | 103219855 A | 7/2013 |
| CN | 203069757 U | 7/2013 |
| CN | 203104839 U | 7/2013 |
| CN | 203217025 U | 9/2013 |
| CN | 203217031 U | 9/2013 |
| CN | 102335875 B | 10/2013 |
| CN | 102183705 B | 11/2013 |
| CN | 103401377 A | 11/2013 |
| CN | 203312948 U | 11/2013 |
| CN | 203324417 U | 12/2013 |
| CN | 103530442 A | 1/2014 |
| CN | 203385821 U | 1/2014 |
| CN | 203416067 U | 1/2014 |
| CN | 102495324 B | 2/2014 |
| CN | 103558504 A | 2/2014 |
| CN | 103576051 A | 2/2014 |
| CN | 203466650 U | 3/2014 |
| CN | 203504327 U | 3/2014 |
| CN | 103762552 A | 4/2014 |
| CN | 103779835 A | 5/2014 |
| CN | 103792463 A | 5/2014 |
| CN | 103809118 A | 5/2014 |
| CN | 203660507 U | 6/2014 |
| CN | 203732667 U | 7/2014 |
| CN | 104021928 A | 9/2014 |
| CN | 104062541 A | 9/2014 |
| CN | 102360054 B | 10/2014 |
| CN | 102983550 B | 11/2014 |
| CN | 104158356 A | 11/2014 |
| CN | 203941260 U | 11/2014 |
| CN | 204031500 U | 12/2014 |
| CN | 102721897 B | 1/2015 |
| CN | 102998591 B | 1/2015 |
| CN | 104345246 A | 2/2015 |
| CN | 02841291 B | 3/2015 |
| CN | 204271782 U | 4/2015 |
| CN | 204271783 U | 4/2015 |
| CN | 204271784 U | 4/2015 |
| CN | 204360899 U | 5/2015 |
| CN | 104682598 A | 6/2015 |
| CN | 104808105 A | 7/2015 |
| CN | 204479697 U | 7/2015 |
| CN | 103278728 B | 9/2015 |
| CN | 103487718 B | 11/2015 |
| CN | 103322932 B | 12/2015 |
| CN | 103558547 B | 12/2015 |
| CN | 105203912 A | 12/2015 |
| CN | 103529350 B | 1/2016 |
| CN | 103412237 B | 3/2016 |
| CN | 103293437 B | 4/2016 |
| CN | 103926506 B | 4/2016 |
| CN | 105527537 A | 4/2016 |
| CN | 103824676 B | 5/2016 |
| CN | 103713235 B | 6/2016 |
| CN | 105699840 A | 6/2016 |
| CN | 205280871 U | 6/2016 |
| CN | 104035029 B | 8/2016 |
| CN | 103593491 B | 9/2016 |
| CN | 103926507 B | 9/2016 |
| CN | 105976999 A | 9/2016 |
| CN | 105978204 A | 9/2016 |
| CN | 205643427 U | 10/2016 |
| CN | 205665349 U | 10/2016 |
| CN | 106124923 A | 11/2016 |
| CN | 106124941 A | 11/2016 |
| CN | 205691743 U | 11/2016 |
| CN | 106199325 A | 12/2016 |
| CN | 106199424 A | 12/2016 |

(56)        References Cited

FOREIGN PATENT DOCUMENTS

| CN | 106226661 | A | 12/2016 |
| CN | 106249150 | A | 12/2016 |
| CN | 205809224 | U | 12/2016 |
| CN | 205809251 | U | 12/2016 |
| CN | 103792462 | B | 1/2017 |
| CN | 103823150 | B | 1/2017 |
| CN | 104155567 | B | 1/2017 |
| CN | 205982509 | U | 2/2017 |
| CN | 106526406 | A | 3/2017 |
| CN | 106546869 | A | 3/2017 |
| CN | 106546893 | A | 3/2017 |
| CN | 206038827 | U | 3/2017 |
| CN | 104078932 | B | 5/2017 |
| CN | 106680656 | A | 5/2017 |
| CN | 106707093 | A | 5/2017 |
| CN | 106771514 | A | 5/2017 |
| CN | 106771840 | A | 5/2017 |
| CN | 106772038 | A | 5/2017 |
| CN | 106786368 | A | 5/2017 |
| CN | 206164243 | U | 5/2017 |
| CN | 206164244 | U | 5/2017 |
| CN | 206178079 | U | 5/2017 |
| CN | 206178081 | U | 5/2017 |
| CN | 206193140 | U | 5/2017 |
| CN | 104569733 | B | 6/2017 |
| CN | 106816291 | A | 6/2017 |
| CN | 206258539 | U | 6/2017 |
| CN | 206292287 | U | 6/2017 |
| CN | 104597367 | B | 7/2017 |
| CN | 206311711 | U | 7/2017 |
| CN | 206313567 | U | 7/2017 |
| CN | 107015148 | A | 8/2017 |
| CN | 107037311 | A | 8/2017 |
| CN | 107064726 | A | 8/2017 |
| CN | 107101652 | A | 8/2017 |
| CN | 206367900 | U | 8/2017 |
| CN | 206369781 | U | 8/2017 |
| CN | 206379854 | U | 8/2017 |
| CN | 206388608 | U | 8/2017 |
| CN | 206411219 | U | 8/2017 |
| CN | 104764974 | B | 9/2017 |
| CN | 107153146 | A | 9/2017 |
| CN | 107179442 | A | 9/2017 |
| CN | 206470354 | U | 9/2017 |
| CN | 107247208 | A | 10/2017 |
| CN | 107271837 | A | 10/2017 |
| CN | 105137275 | B | 11/2017 |
| CN | 105277835 | B | 11/2017 |
| CN | 107332209 | A | 11/2017 |
| CN | 107367691 | A | 11/2017 |
| CN | 206618840 | U | 11/2017 |
| CN | 104345247 | B | 12/2017 |
| CN | 104901276 | B | 12/2017 |
| CN | 107462807 | A | 12/2017 |
| CN | 107505553 | A | 12/2017 |
| CN | 206756974 | U | 12/2017 |
| CN | 206876809 | U | 1/2018 |
| CN | 206920547 | U | 1/2018 |
| CN | 107741555 | A | 2/2018 |
| CN | 206975158 | U | 2/2018 |
| CN | 206991615 | U | 2/2018 |
| CN | 207037054 | U | 2/2018 |
| CN | 104991161 | B | 3/2018 |
| CN | 107748320 | A | 3/2018 |
| CN | 107769421 | A | 3/2018 |
| CN | 107917661 | A | 4/2018 |
| CN | 107919651 | A | 4/2018 |
| CN | 105719815 | B | 5/2018 |
| CN | 108008242 | A | 5/2018 |
| CN | 108037455 | A | 5/2018 |
| CN | 108051698 | A | 5/2018 |
| CN | 108199349 | A | 6/2018 |
| CN | 105550496 | B | 7/2018 |
| CN | 108279359 | A | 7/2018 |
| CN | 108318777 | A | 7/2018 |
| CN | 207588585 | U | 7/2018 |
| CN | 108387769 | A | 8/2018 |
| CN | 108462276 | A | 8/2018 |
| CN | 207730874 | U | 8/2018 |
| CN | 105425100 | B | 9/2018 |
| CN | 106452234 | B | 9/2018 |
| CN | 108490303 | A | 9/2018 |
| CN | 108594062 | A | 9/2018 |
| CN | 108594143 | A | 9/2018 |
| CN | 107422190 | B | 10/2018 |
| CN | 108663597 | A | 10/2018 |
| CN | 208026819 | U | 10/2018 |
| CN | 208026824 | U | 10/2018 |
| CN | 106230213 | B | 11/2018 |
| CN | 108736669 | A | 11/2018 |
| CN | 108802523 | A | 11/2018 |
| CN | 108802548 | A | 11/2018 |
| CN | 108828397 | A | 11/2018 |
| CN | 108899872 | A | 11/2018 |
| CN | 108919040 | A | 11/2018 |
| CN | 108920731 | A | 11/2018 |
| CN | 208043990 | U | 11/2018 |
| CN | 208060660 | U | 11/2018 |
| CN | 109100608 | A | 12/2018 |
| CN | 109100609 | A | 12/2018 |
| CN | 208188242 | U | 12/2018 |
| CN | 208257390 | U | 12/2018 |
| CN | 105548799 | B | 1/2019 |
| CN | 106249144 | B | 1/2019 |
| CN | 109142943 | A | 1/2019 |
| CN | 109188123 | A | 1/2019 |
| CN | 109188185 | A | 1/2019 |
| CN | 109256750 | A | 1/2019 |
| CN | 109274068 | A | 1/2019 |
| CN | 106054078 | B | 2/2019 |
| CN | 109375076 | A | 2/2019 |
| CN | 109378919 | A | 2/2019 |
| CN | 105891660 | B | 3/2019 |
| CN | 106124946 | B | 3/2019 |
| CN | 106841901 | B | 3/2019 |
| CN | 109446707 | A | 3/2019 |
| CN | 109460609 | A | 3/2019 |
| CN | 109470978 | A | 3/2019 |
| CN | 208588789 | U | 3/2019 |
| CN | 106569080 | B | 4/2019 |
| CN | 106841900 | B | 4/2019 |
| CN | 106505520 | B | 5/2019 |
| CN | 106772028 | B | 5/2019 |
| CN | 106772039 | B | 5/2019 |
| CN | 109738739 | A | 5/2019 |
| CN | 208902834 | U | 5/2019 |
| CN | 106443318 | B | 6/2019 |
| CN | 106771835 | B | 6/2019 |
| CN | 107132450 | B | 6/2019 |
| CN | 107153147 | B | 6/2019 |
| CN | 107167695 | B | 6/2019 |
| CN | 109901005 | A | 6/2019 |
| CN | 109901009 | A | 6/2019 |
| CN | 109901030 | A | 6/2019 |
| CN | 109901069 | A | 6/2019 |
| CN | 106034690 | B | 7/2019 |
| CN | 106501665 | B | 7/2019 |
| CN | 106772037 | B | 7/2019 |
| CN | 107731067 | B | 7/2019 |
| CN | 209087480 | U | 7/2019 |
| CN | 106324415 | B | 8/2019 |
| CN | 110146777 | A | 8/2019 |
| CN | 110161366 | A | 8/2019 |
| CN | 110186785 | A | 8/2019 |
| CN | 209217826 | U | 8/2019 |
| CN | 106093686 | B | 9/2019 |
| CN | 107743004 | B | 9/2019 |
| CN | 209357533 | U | 9/2019 |
| CN | 209400633 | U | 9/2019 |
| CN | 209516773 | U | 10/2019 |
| CN | 209561075 | U | 10/2019 |
| CN | 106019045 | B | 11/2019 |
| CN | 106019148 | B | 11/2019 |
| CN | 107356837 | B | 11/2019 |

(56)                    References Cited

FOREIGN PATENT DOCUMENTS

| | | | |
|---|---|---|---|
| CN | 108566131 | B | 11/2019 |
| CN | 108879606 | B | 11/2019 |
| CN | 110417136 | A | 11/2019 |
| CN | 209606602 | U | 11/2019 |
| CN | 209626009 | U | 11/2019 |
| CN | 106709128 | B | 12/2019 |
| CN | 108318791 | B | 12/2019 |
| CN | 110531215 | A | 12/2019 |
| CN | 110554279 | A | 12/2019 |
| CN | 110581532 | A | 12/2019 |
| CN | 110596521 | A | 12/2019 |
| CN | 110618381 | A | 12/2019 |
| CN | 108072812 | B | 1/2020 |
| CN | 109100600 | B | 1/2020 |
| CN | 110716138 | A | 1/2020 |
| CN | 110716152 | A | 1/2020 |
| CN | 110737990 | A | 1/2020 |
| CN | 209896797 | U | 1/2020 |
| CN | 108152659 | B | 2/2020 |
| CN | 110824281 | A | 2/2020 |
| CN | 110058117 | B | 3/2020 |
| CN | 110895322 | A | 3/2020 |
| CN | 210136295 | U | 3/2020 |
| CN | 210167865 | U | 3/2020 |
| CN | 210167866 | U | 3/2020 |
| CN | 108279362 | B | 4/2020 |
| CN | 108535582 | B | 4/2020 |
| CN | 110988751 | A | 4/2020 |
| CN | 111044933 | A | 4/2020 |
| CN | 210273644 | U | 4/2020 |
| CN | 210293947 | U | 4/2020 |
| CN | 210380400 | U | 4/2020 |
| CN | 109617016 | B | 5/2020 |
| CN | 109818333 | B | 5/2020 |
| CN | 111190125 | A | 5/2020 |
| CN | 210572635 | U | 5/2020 |
| CN | 210575468 | U | 5/2020 |
| CN | 210577985 | U | 5/2020 |
| CN | 210579316 | U | 5/2020 |
| CN | 210608540 | U | 5/2020 |
| CN | 108732522 | B | 7/2020 |
| CN | 109239513 | B | 7/2020 |
| CN | 111474496 | A | 7/2020 |
| CN | 210954262 | U | 7/2020 |
| CN | 211127357 | U | 7/2020 |
| CN | 107846165 | B | 8/2020 |
| CN | 110346685 | B | 8/2020 |
| CN | 111525508 | A | 8/2020 |
| CN | 111537910 | A | 8/2020 |
| CN | 111537911 | A | 8/2020 |
| CN | 111579991 | A | 8/2020 |
| CN | 111596177 | A | 8/2020 |
| CN | 211183584 | U | 8/2020 |
| CN | 211264739 | U | 8/2020 |
| CN | 108896880 | B | 9/2020 |
| CN | 109142963 | B | 9/2020 |
| CN | 111613411 | A | 9/2020 |
| CN | 111624515 | A | 9/2020 |
| CN | 111625762 | A | 9/2020 |
| CN | 111665441 | A | 9/2020 |
| CN | 111666703 | A | 9/2020 |
| CN | 111679163 | A | 9/2020 |
| CN | 111693896 | A | 9/2020 |
| CN | 111707936 | A | 9/2020 |
| CN | 111722145 | A | 9/2020 |
| CN | 211554247 | U | 9/2020 |
| CN | 211555664 | U | 9/2020 |
| CN | 108132412 | B | 10/2020 |
| CN | 109473949 | B | 10/2020 |
| CN | 111766535 | A | 10/2020 |
| CN | 111835113 | A | 10/2020 |
| CN | 211786033 | U | 10/2020 |
| CN | 211786035 | U | 10/2020 |
| CN | 211828446 | U | 10/2020 |
| CN | 111983513 | A | 11/2020 |
| CN | 212031545 | U | 11/2020 |
| CN | 107783006 | B | 12/2020 |
| CN | 108414932 | B | 12/2020 |
| CN | 111736093 | B | 12/2020 |
| CN | 111965543 | B | 12/2020 |
| CN | 112016395 | A | 12/2020 |
| CN | 112034344 | A | 12/2020 |
| CN | 112034396 | A | 12/2020 |
| CN | 112083349 | A | 12/2020 |
| CN | 112098891 | A | 12/2020 |
| CN | 112147548 | A | 12/2020 |
| CN | 212133561 | U | 12/2020 |
| CN | 212255639 | U | 12/2020 |
| CN | 109387734 | B | 1/2021 |
| CN | 112162213 | A | 1/2021 |
| CN | 112163680 | A | 1/2021 |
| CN | 112180290 | A | 1/2021 |
| CN | 112180299 | A | 1/2021 |
| CN | 212322499 | U | 1/2021 |
| CN | 108107315 | B | 2/2021 |
| CN | 112305421 | A | 2/2021 |
| CN | 112327208 | A | 2/2021 |
| CN | 112379223 | A | 2/2021 |
| CN | 112395793 | A | 2/2021 |
| CN | 112398091 | A | 2/2021 |
| CN | 112415384 | A | 2/2021 |
| CN | 112415389 | A | 2/2021 |
| CN | 109212374 | B | 3/2021 |
| CN | 109342877 | B | 3/2021 |
| CN | 109507520 | B | 3/2021 |
| CN | 110456299 | B | 3/2021 |
| CN | 112462293 | A | 3/2021 |
| CN | 112486035 | A | 3/2021 |
| CN | 112505581 | A | 3/2021 |
| CN | 112526306 | A | 3/2021 |
| CN | 112528545 | A | 3/2021 |
| CN | 212781183 | U | 3/2021 |
| CN | 212808540 | U | 3/2021 |
| CN | 212811270 | U | 3/2021 |
| CN | 212811271 | U | 3/2021 |
| CN | 212845842 | U | 3/2021 |
| CN | 110247372 | B | 4/2021 |
| CN | 112731204 | A | 4/2021 |
| CN | 112731211 | A | 4/2021 |
| CN | 213093942 | U | 4/2021 |
| CN | 109613387 | B | 5/2021 |
| CN | 109657720 | B | 5/2021 |
| CN | 109884448 | B | 5/2021 |
| CN | 110161352 | B | 5/2021 |
| CN | 110297183 | B | 5/2021 |
| CN | 110531205 | B | 5/2021 |
| CN | 110794331 | B | 5/2021 |
| CN | 111142048 | B | 5/2021 |
| CN | 111244894 | B | 5/2021 |
| CN | 111308346 | B | 5/2021 |
| CN | 112782494 | A | 5/2021 |
| CN | 112834955 | A | 5/2021 |
| CN | 110649846 | B | 6/2021 |
| CN | 111551849 | B | 6/2021 |
| CN | 112926728 | A | 6/2021 |
| CN | 112946523 | A | 6/2021 |
| CN | 112946530 | A | 6/2021 |
| CN | 112965007 | A | 6/2021 |
| CN | 112986817 | A | 6/2021 |
| CN | 113009337 | A | 6/2021 |
| CN | 113009338 | A | 6/2021 |
| CN | 113013856 | A | 6/2021 |
| CN | 113030727 | A | 6/2021 |
| CN | 113049957 | A | 6/2021 |
| CN | 213423377 | U | 6/2021 |
| CN | 213482425 | U | 6/2021 |
| CN | 213517514 | U | 6/2021 |
| CN | 109581219 | B | 7/2021 |
| CN | 111525850 | B | 7/2021 |
| CN | 113093052 | A | 7/2021 |
| CN | 113109737 | A | 7/2021 |
| CN | 113156309 | A | 7/2021 |
| CN | 113179074 | A | 7/2021 |
| CN | 113189515 | A | 7/2021 |

(56) References Cited

FOREIGN PATENT DOCUMENTS

| CN | 113193813 A | 7/2021 |
| CN | 213689836 U | 7/2021 |
| CN | 213693268 U | 7/2021 |
| CN | 213843466 U | 7/2021 |
| CN | 110208642 B | 8/2021 |
| CN | 110531266 B | 8/2021 |
| CN | 112420351 B | 8/2021 |
| CN | 113030553 B | 8/2021 |
| CN | 113203945 A | 8/2021 |
| CN | 113238165 A | 8/2021 |
| CN | 113295999 A | 8/2021 |
| CN | 113311356 A | 8/2021 |
| CN | 213875983 U | 8/2021 |
| CN | 213875984 U | 8/2021 |
| CN | 213986692 U | 8/2021 |
| CN | 213986710 U | 8/2021 |
| CN | 213986777 U | 8/2021 |
| CN | 108170981 B | 9/2021 |
| CN | 108733937 B | 9/2021 |
| CN | 109061475 B | 9/2021 |
| CN | 109901008 B | 9/2021 |
| CN | 112881909 B | 9/2021 |
| CN | 112910143 B | 9/2021 |
| CN | 113341317 A | 9/2021 |
| CN | 113359027 A | 9/2021 |
| CN | 113391235 A | 9/2021 |
| CN | 113406540 A | 9/2021 |
| CN | 113433453 A | 9/2021 |
| CN | 214150965 U | 9/2021 |
| CN | 214201735 U | 9/2021 |
| CN | 214310761 U | 9/2021 |
| CN | 110749838 B | 10/2021 |
| CN | 111239646 B | 10/2021 |
| CN | 111308345 B | 10/2021 |
| CN | 113093054 B | 10/2021 |
| CN | 113466752 A | 10/2021 |
| CN | 113466753 A | 10/2021 |
| CN | 113484800 A | 10/2021 |
| CN | 113514776 A | 10/2021 |
| CN | 214337675 U | 10/2021 |
| CN | 214337676 U | 10/2021 |
| CN | 214375162 U | 10/2021 |
| CN | 110470957 B | 11/2021 |
| CN | 110488162 B | 11/2021 |
| CN | 111123105 B | 11/2021 |
| CN | 111490522 B | 11/2021 |
| CN | 113189459 B | 11/2021 |
| CN | 113625116 A | 11/2021 |
| CN | 113625117 A | 11/2021 |
| CN | 113687261 A | 11/2021 |
| CN | 113702831 A | 11/2021 |
| CN | 113702877 A | 11/2021 |
| CN | 113721180 A | 11/2021 |
| CN | 110780200 B | 12/2021 |
| CN | 113740764 A | 12/2021 |
| CN | 113759248 A | 12/2021 |
| CN | 113759284 A | 12/2021 |
| CN | 113759285 A | 12/2021 |
| CN | 113777523 A | 12/2021 |
| CN | 113779829 A | 12/2021 |
| CN | 113792636 A | 12/2021 |
| CN | 113824363 A | 12/2021 |
| CN | 113852046 A | 12/2021 |
| CN | 215170542 U | 12/2021 |
| CN | 215180806 U | 12/2021 |
| CN | 215375698 U | 12/2021 |
| CN | 111123104 B | 1/2022 |
| CN | 113075584 B | 1/2022 |
| CN | 113937730 A | 1/2022 |
| CN | 113985289 A | 1/2022 |
| CN | 110927574 B | 2/2022 |
| CN | 110940917 B | 2/2022 |
| CN | 111308291 B | 2/2022 |
| CN | 113064073 B | 2/2022 |
| CN | 113552452 B | 2/2022 |
| CN | 114002595 A | 2/2022 |
| CN | 114002626 A | 2/2022 |
| CN | 114019298 A | 2/2022 |
| CN | 114034959 A | 2/2022 |
| CN | 114035115 A | 2/2022 |
| CN | 114035116 A | 2/2022 |
| CN | 114035126 A | 2/2022 |
| CN | 114065804 A | 2/2022 |
| CN | 215768830 U | 2/2022 |
| CN | 112526411 B | 3/2022 |
| CN | 113484793 B | 3/2022 |
| CN | 114123665 A | 3/2022 |
| CN | 114123899 A | 3/2022 |
| CN | 114137443 A | 3/2022 |
| CN | 114167305 A | 3/2022 |
| CN | 114186666 A | 3/2022 |
| CN | 114200302 A | 3/2022 |
| CN | 114200303 A | 3/2022 |
| CN | 215986428 U | 3/2022 |
| CN | 216098473 U | 3/2022 |
| CN | 112904161 B | 4/2022 |
| CN | 113848477 B | 4/2022 |
| CN | 114264976 A | 4/2022 |
| CN | 114325267 A | 4/2022 |
| CN | 114325466 A | 4/2022 |
| CN | 114333518 A | 4/2022 |
| CN | 114337394 A | 4/2022 |
| CN | 114355190 A | 4/2022 |
| CN | 114397601 A | 4/2022 |
| CN | 114397602 A | 4/2022 |
| CN | 114417632 A | 4/2022 |
| CN | 216209710 U | 4/2022 |
| CN | 216248246 U | 4/2022 |
| CN | 110967654 B | 5/2022 |
| CN | 112290857 B | 5/2022 |
| CN | 114428212 A | 5/2022 |
| CN | 114429069 A | 5/2022 |
| CN | 114441962 A | 5/2022 |
| CN | 114487714 A | 5/2022 |
| CN | 114487904 A | 5/2022 |
| CN | 114487911 A | 5/2022 |
| CN | 114499321 A | 5/2022 |
| CN | 114509649 A | 5/2022 |
| CN | 114513150 A | 5/2022 |
| CN | 114528870 A | 5/2022 |
| CN | 114531085 A | 5/2022 |
| CN | 114545296 A | 5/2022 |
| CN | 114563700 A | 5/2022 |
| CN | 216622643 U | 5/2022 |
| CN | 216649356 U | 5/2022 |
| CN | 112688273 B | 6/2022 |
| CN | 112968423 B | 6/2022 |
| CN | 114578269 A | 6/2022 |
| CN | 114624629 A | 6/2022 |
| CN | 216749041 U | 6/2022 |
| DE | 155358 A1 | 6/1982 |
| DE | 3141998 A1 | 5/1983 |
| DE | 200928 A1 | 6/1983 |
| DE | 220715 A1 | 4/1985 |
| DE | 231859 A1 | 1/1986 |
| DE | 3600814 A1 | 7/1987 |
| DE | 258666 A1 | 7/1988 |
| DE | 3303713 C2 | 4/1992 |
| DE | 19703161 A1 | 7/1998 |
| EP | 0255658 B1 | 1/1993 |
| EP | 0371933 B1 | 9/1993 |
| EP | 3393011 A1 | 10/2018 |
| EP | 3321706 B1 | 12/2021 |
| FR | 2511207 A1 | 2/1983 |
| FR | 3079361 A1 | 9/2019 |
| IN | 308373 B | 2/2010 |
| IN | 290337 B | 1/2011 |
| IN | 1071/MUM/2011 | 2/2012 |
| IN | 3966/MUM/2013 | 1/2014 |
| IN | 201621021851 A | 8/2016 |
| IN | 202031054142 A | 6/2022 |
| JP | 8-236384 A | 9/1996 |
| JP | 2002-62330 A | 2/2002 |
| JP | 2013-61310 A | 4/2013 |

(56)           References Cited

FOREIGN PATENT DOCUMENTS

| KR | 10-2008942 | B1 | 10/2019 |
| KR | 10-2167770 | B1 | 10/2020 |
| PL | 199508 | B1 | 9/2008 |
| RU | 1780052 | A1 | 12/1992 |
| RU | 1820940 | A3 | 6/1993 |
| RU | 2024158 | C1 | 11/1994 |
| RU | 2361349 | C1 | 7/2009 |
| RU | 2011109443 | | 9/2012 |
| RU | 2013106935 | A | 8/2014 |
| RU | 2015108101 | A | 9/2016 |
| RU | 2016118352 | A | 11/2017 |
| RU | 181804 | U1 | 7/2018 |
| RU | 192269 | U1 | 9/2019 |
| RU | 192270 | U1 | 9/2019 |
| RU | 193235 | U1 | 10/2019 |
| RU | 194962 | U1 | 1/2020 |
| SU | 527800 | A1 | 9/1976 |
| SU | 531103 | A1 | 10/1976 |
| SU | 555493 | A1 | 4/1977 |
| SU | 598174 | A1 | 3/1978 |
| SU | 677038 | A1 | 7/1979 |
| SU | 702452 | A1 | 12/1979 |
| SU | 711498 | A1 | 1/1980 |
| SU | 744367 | A1 | 6/1980 |
| SU | 746342 | A1 | 7/1980 |
| SU | 783721 | A1 | 11/1980 |
| SU | 853569 | A1 | 8/1981 |
| SU | 917257 | A1 | 3/1982 |
| SU | 928510 | A1 | 5/1982 |
| SU | 938213 | A1 | 6/1982 |
| SU | 1005239 | A1 | 3/1983 |
| SU | 1032433 | A1 | 7/1983 |
| SU | 1054882 | A1 | 11/1983 |
| SU | 1071977 | A1 | 2/1984 |
| SU | 1145411 | A1 | 3/1985 |
| SU | 1146734 | A1 | 3/1985 |
| SU | 1149344 | A2 | 4/1985 |
| SU | 1170383 | A1 | 7/1985 |
| SU | 1255965 | A1 | 9/1986 |
| SU | 1262426 | A1 | 10/1986 |
| SU | 1265921 | A2 | 10/1986 |
| SU | 1274078 | A1 | 11/1986 |
| SU | 1311806 | A1 | 5/1987 |
| SU | 1348752 | A1 | 10/1987 |
| SU | 1352579 | A1 | 11/1987 |
| SU | 1381655 | A1 | 3/1988 |
| SU | 1420555 | A1 | 8/1988 |
| SU | 1429227 | A1 | 10/1988 |
| SU | 1465829 | A1 | 3/1989 |
| SU | 1465830 | A1 | 3/1989 |
| SU | 1486810 | A1 | 6/1989 |
| SU | 1541702 | A1 | 2/1990 |
| SU | 1591128 | A1 | 9/1990 |
| SU | 1675800 | A1 | 9/1991 |
| SU | 1714539 | A1 | 2/1992 |
| SU | 1739321 | A1 | 6/1992 |
| SU | 1746458 | A1 | 7/1992 |
| SU | 1772769 | A1 | 10/1992 |
| TH | 117979 | A | 11/2012 |
| TW | M584429 | U | 10/2019 |
| WO | WO 2014/173132 | A1 | 10/2014 |
| WO | WO 2020/134198 | A1 | 7/2020 |
| WO | WO 2022/087726 | A1 | 5/2022 |

* cited by examiner

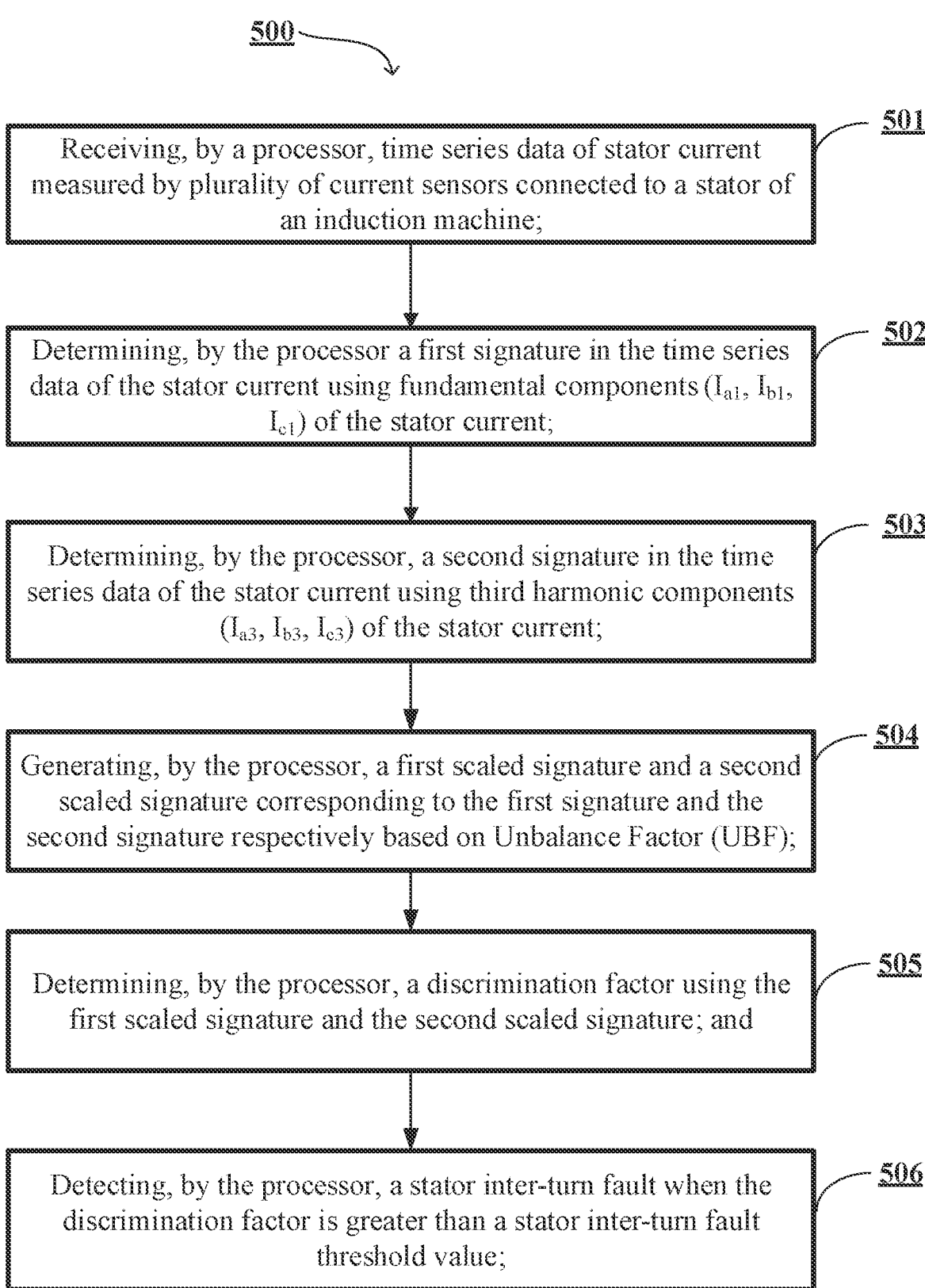

500

Receiving, by a processor, time series data of stator current measured by plurality of current sensors connected to a stator of an induction machine;    501

Determining, by the processor a first signature in the time series data of the stator current using fundamental components ($I_{a1}$, $I_{b1}$, $I_{c1}$) of the stator current;    502

Determining, by the processor, a second signature in the time series data of the stator current using third harmonic components ($I_{a3}$, $I_{b3}$, $I_{c3}$) of the stator current;    503

Generating, by the processor, a first scaled signature and a second scaled signature corresponding to the first signature and the second signature respectively based on Unbalance Factor (UBF);    504

Determining, by the processor, a discrimination factor using the first scaled signature and the second scaled signature; and    505

Detecting, by the processor, a stator inter-turn fault when the discrimination factor is greater than a stator inter-turn fault threshold value;    506

METHOD AND SYSTEM FOR DETECTING STATOR INTER-TURN FAULT IN INDUCTION MACHINES

CROSS-REFERENCE TO RELATED APPLICATIONS

The instant application claims priority to Indian Patent Application No. 202341004310, filed Jan. 22, 2023, which is incorporated herein in its entirety by reference.

FIELD OF THE DISCLOSURE

The present disclosure generally relates to fault detection in an induction machine and, more particularly, to method and system for detecting a stator inter-turn fault in the induction machine.

BACKGROUND OF THE INVENTION

Induction machines have been widely used in many application sectors for a long time. The robustness and structural simplicity of the induction machine have assured reliable performance underlining its popularity over the years. Despite their sturdy construction, induction machines are still prone to faults which can bring a critical process to a standstill and cause huge losses. Therefore, it is critical that all-round protection is available to ensure proper functioning of the machine. An early fault detection and warning is highly important to reduce the damages and undertake a planned maintenance. The common category of internal faults in induction machines are stator inter-turn short circuits, voltage unbalance issues, eccentricity, and broken rotor bar faults. Among the common internal faults, the occurrence of stator inter-turn fault is more frequent. A conventional system for detecting the stator inter-turn faults uses search coils or flux coils, zero sequence impedance/voltage measurements, spectral current analysis with neural networks, etc. causing complicated circuits. The conventional systems also suffer difficulty in differentiating the faults in the induction machines, as signatures of the one or more faults such as stator inter-turn fault and voltage unbalance appear similar to each other. Therefore, it is essential to have a more efficient and faster/real-time protection system to detect the stator inter-turn fault in the induction machines. And at the same time the detection of the faults depends on easily available input data.

BRIEF SUMMARY OF THE INVENTION

In an embodiment, the present disclosure discloses a method for detecting stator inter-turn fault in induction machines. The method comprises receiving time series data of stator currents measured by plurality of current sensors connected to a stator of an induction machine. Upon receiving the time series of stator current, the fundamental components ($I_{a1}$, $I_{b1}$, $I_{c1}$) and third harmonic components ($I_{a3}$, $I_{b3}$, $I_{c3}$) are determined using transformation matrix on time series data of stator currents. The first signature in the time series data of stator current is determined using base factors M1 and M2 where the base factors M1 and M2 are determined using a transformation matrix on the fundamental components ($I_{a1}$, $I_{b1}$, $I_{c1}$) of the stator current.

In parallel to the first signature, a second signature in the times series data of stator current is determined using the base factors N1 and N2 where the base factors N1 and N2 are determined using a transformation matrix on the harmonic components ($I_{a3}$, $I_{b3}$, $I_{c3}$) of the stator current. Upon determining the first signature and the second signature the scaled signature of the first signature and the second signature using the Unbalance Factor (UBF), wherein the UBF is a ratio of negative sequence and positive sequence of the stator current. Upon determining the first scaled signature and second scaled signature, a discrimination factor is determined, wherein the discrimination factor is a ratio of the second scaled signature and the first scaled signature. And detecting a stator inter-turn fault when the discrimination factor is greater than a predetermined stator inter-turn fault threshold value.

In an embodiment, the present disclosure discloses an apparatus for detecting stator inter-turn fault in induction machines. The apparatus comprises a memory and a processor. The processor is configured to receive time series data of stator current measured by one or more current sensors connected to a stator of an induction machine; determine a first signature in the time series data of the stator current using fundamental components ($I_{a1}$, $I_{b1}$, $I_{c1}$) of the stator current; determine a second signature in the time series data of the stator current using third harmonic components ($I_{a3}$, $I_{b3}$, $I_{c3}$) of the stator current; determine a first scaled signature and a second scaled signature corresponding to the first signature and the second signature respectively based on an Unbalanced Factor (UBF), wherein the UBF is a ratio of negative sequence values and positive sequence values of the stator current; determine a discrimination factor using the first scaled signature and the second signature, wherein the discrimination factor is a ratio of the second scaled signature and the first signature; and detect a stator inter-turn fault when the discrimination factor is greater than a stator inter-turn fault threshold value.

In an embodiment, the present disclosure system to detect the stator inter-turn fault in an induction machine. The system comprises an induction machine, a plurality of current sensors, a processor and a memory communicatively coupled with processor.

In an embodiment, the present disclosure along with stator inter-turn fault also detects severity of stator inter-turn fault, a voltage unbalance and a single phasing in the induction machine.

In an alternate embodiment, the present disclosure utilizes only the current parameter of the induction machine to detect the stator inter-turn faults, the severity of the stator inter-turn faults, the voltage unbalance and the single phasing in the induction machine.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE SEVERAL VIEWS OF THE DRAWING(S)

The accompanying drawings, which are incorporated in and constitute a part of this disclosure, illustrate exemplary embodiments and, together with the description, serve to explain the disclosed principles. In the figures, the left-most digit(s) of a reference number identifies the figure in which the reference number first appears. The same numbers are used throughout the figures to reference features and components. Some embodiments of device and/or methods in accordance with embodiments of the present subject matter are now described, by way of example only, and with reference to the accompanying figures, in which:

Figure 3A:
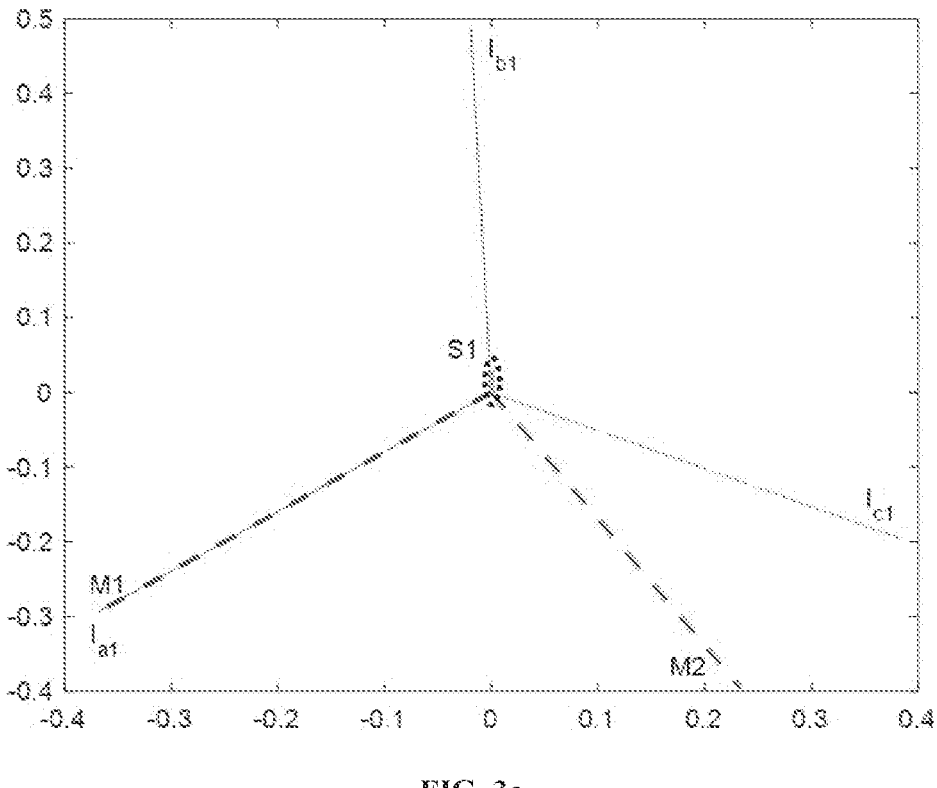
Figure 3B:
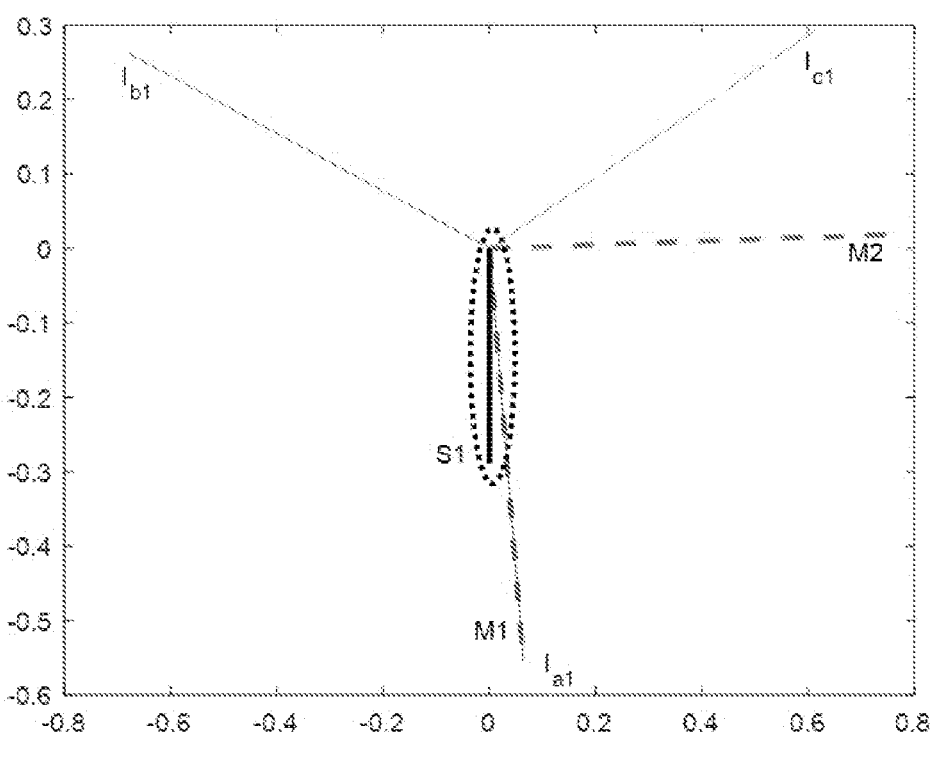

Each of FIGS. 3a and 3b is a graph illustrating phasors for stator current components, base factors of a first signature and a first signature in an induction machine under healthy and faulty condition, in accordance with some embodiments of the present disclosure.

Figure 4A:
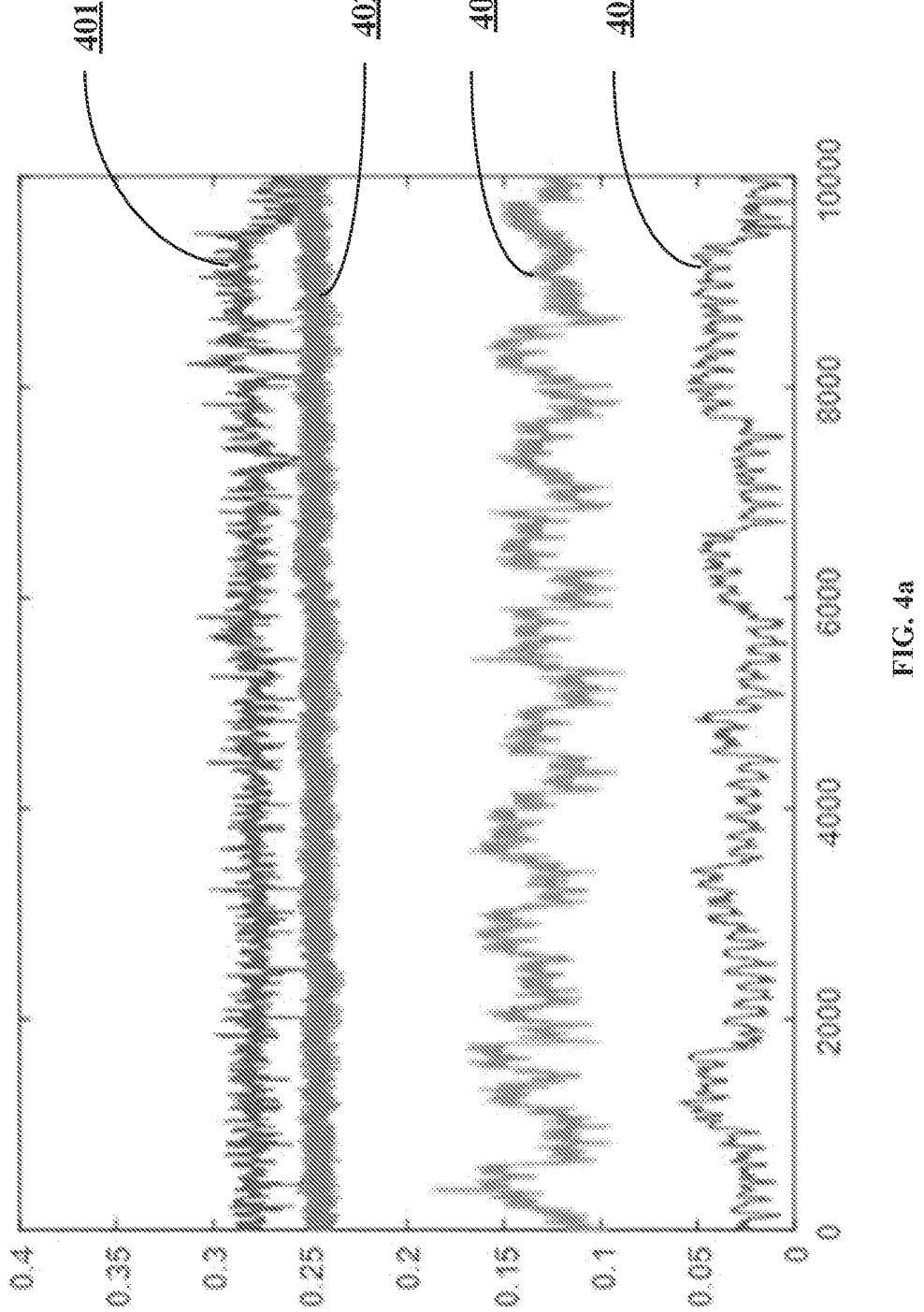
Figure 4B:
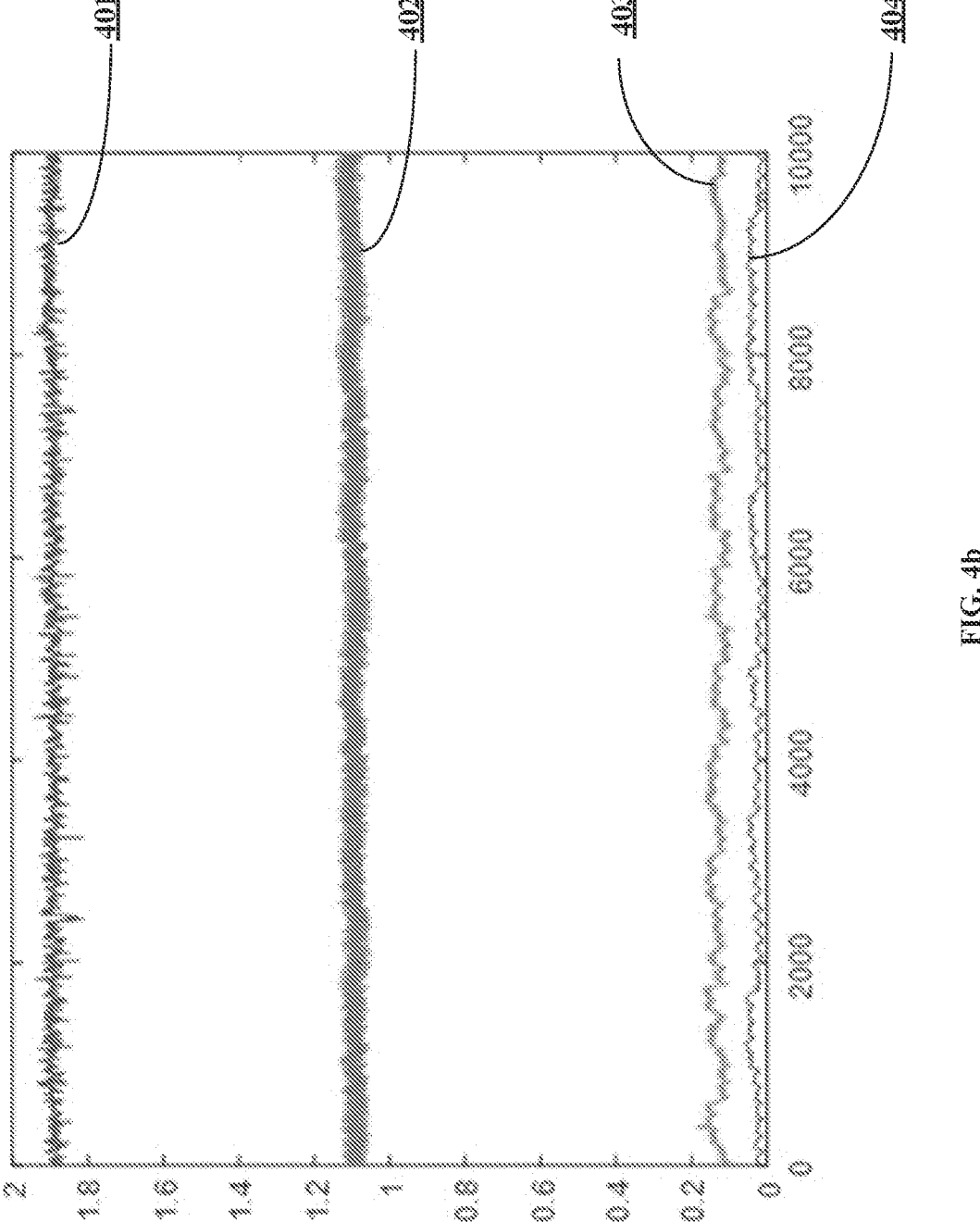

FIGS. 4a and 4b illustrate waveforms for different conditions and faults using the first signature and the first scaled signature respectively, from stator current of an induction machine, in accordance with some embodiments of the present disclosure.

FIG. 5 shows a flowchart illustrating a method for detecting a stator inter-turn fault in an induction machine, in accordance with some embodiments of the present disclosure.

Figure 6:
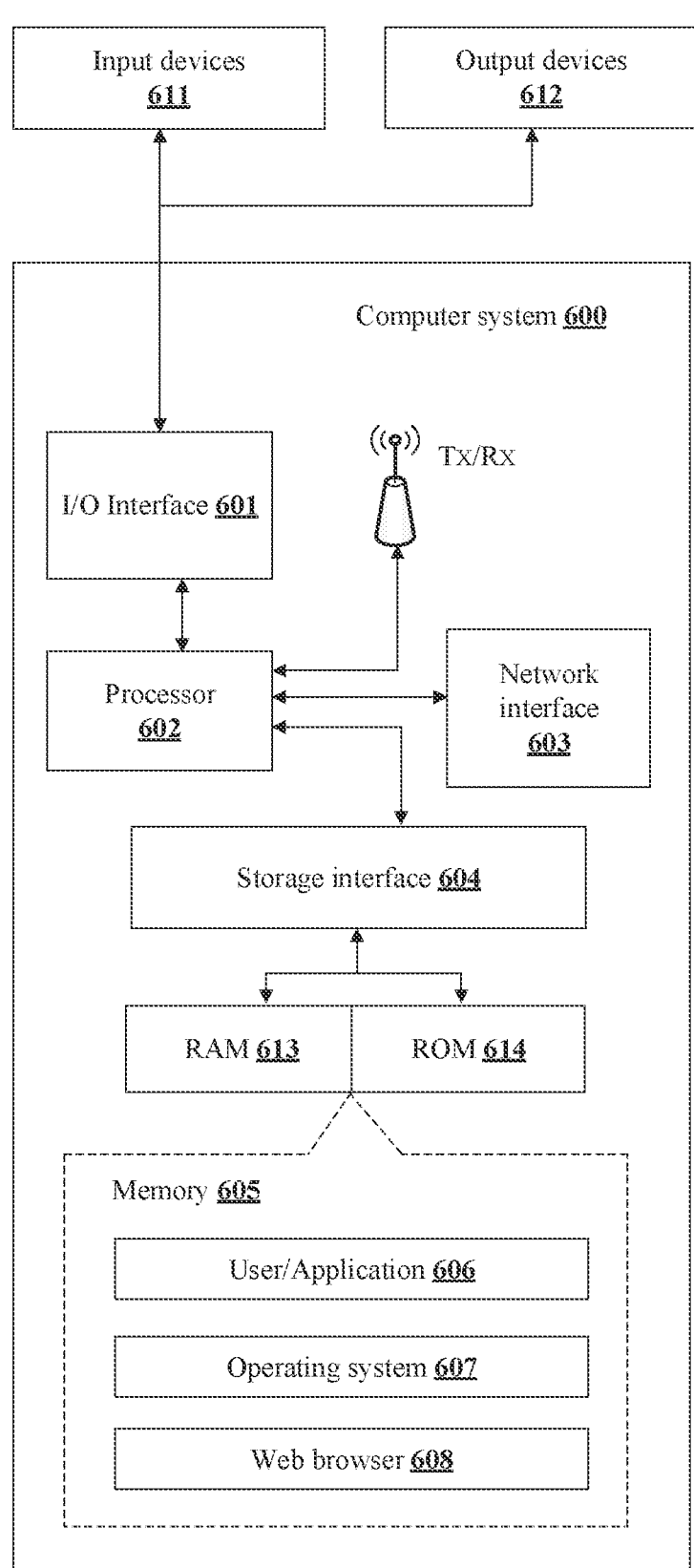

FIG. 6 illustrates an exemplary block diagram of a general-purpose computer system for detecting a stator inter-turn fault in an induction machine, in accordance with some embodiments of the present disclosure.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

DETAILED DESCRIPTION OF THE INVENTION

In the present document, the word "exemplary" is used herein to mean "serving as an example, instance, or illustration". Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternative falling within the spirit and the scope of the disclosure.

The terms "comprises", "comprising", or any other variations thereof, are intended to cover a non-exclusive inclusion, such that a setup, device, or method that comprises a list of components or steps does not include only those components or steps but may include other components or steps not expressly listed or inherent to such setup or device or method. In other words, one or more elements in a device or system or apparatus proceeded by "comprises . . . a" does not, without more constraints, preclude the existence of other elements or additional elements in the device or system or apparatus.

Figure 1:
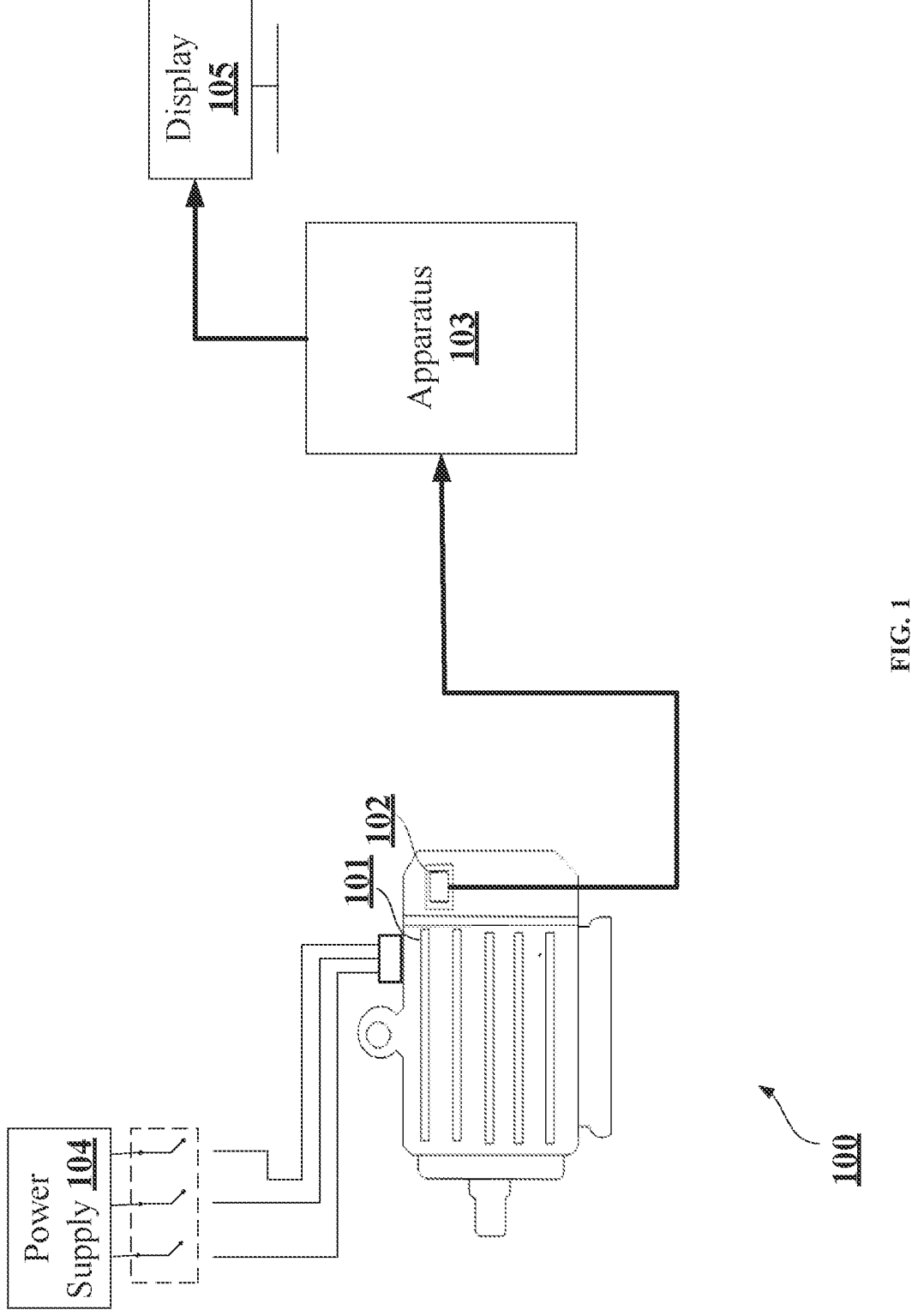
FIG. 1 illustrates a block diagram of an environment for detecting a stator inter-turn fault in an induction machine, in accordance with some embodiments of the present disclosure.

FIG. 1 illustrates a block diagram for detecting a stator inter-turn fault in an induction machine, in accordance with some embodiments of the present disclosure.

In an embodiment, environment 100 comprising an induction machine 101 a plurality of current sensors 102, an apparatus 103, a power supply 104 and a display 105, in which at least some example embodiments of the disclosure can be implemented. In an embodiment, the induction machine 101 is a motor having one or more phases. The apparatus 103 receives time series data of a stator current from the plurality of current sensors 102 connected to a stator of an induction machine 101. The time series is processed by an apparatus 103 to detect inter-turn fault in induction machine 101 which is later displayed on the display 105.

In an embodiment the apparatus 103 can be, without limitation, a software, a hardware or a combination of software and hardware. The apparatus 103 can be used as a standalone system or as an application to perform an action.

In an embodiment, the apparatus 103 is configured to: (1) receive the time series data from the plurality of current sensors 102 connected to the stator of the induction machine 101; (2) determine a first signature in the time series data of the stator current using fundamental components (Ia1, Ib1, Ic1) of the stator current; (3) determine a second signature in the time series data of the stator current using third harmonic components (Ia3, Ib3, Ic3) of the stator current; (4) generate a first scaled signature and a second scaled signature corresponding to the first signature and the second signature respectively based on an Unbalance Factor (UBF); (5) determine a discrimination factor using the first scaled signature and the second scaled signature; and (6) detect a stator inter-turn fault when the discrimination factor is greater than a stator inter-turn fault threshold value. Thus, the apparatus 103 detects stator inter-turn faults efficiently and clearly distinguishing them from other induction machine 101 faults. The signature of the faults using first scaled signature 214 and second scaled signature 215 is displayed on the display 105, when the faults reach the respective threshold values the apparatus 103 displays an alarm indicating detection of fault on the display 105.

Figure 2:
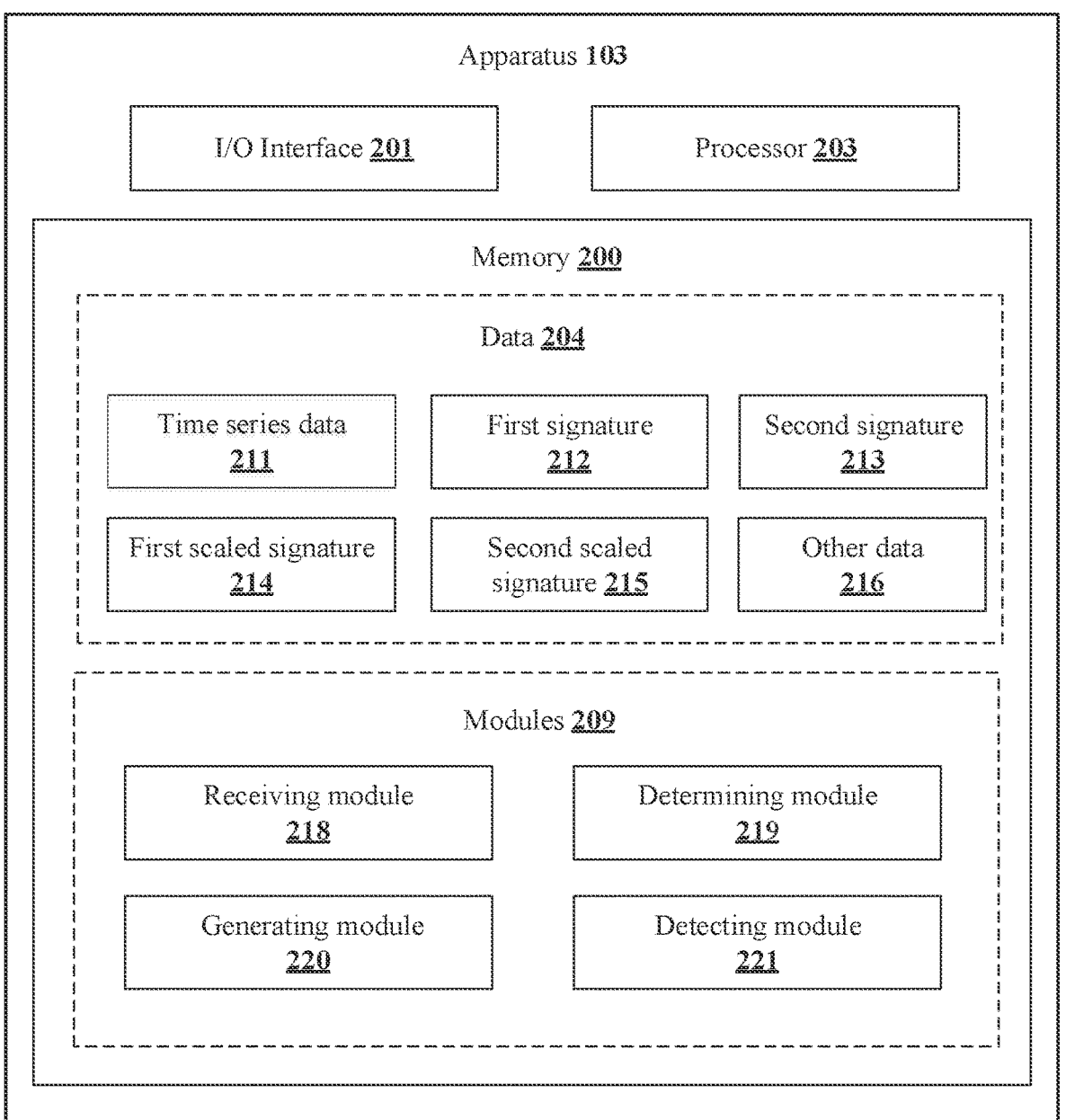
FIG. 2 illustrates an apparatus for detecting a stator inter-turn fault in an induction machine, in accordance with some embodiments of the present disclosure.

FIG. 2 illustrates the apparatus for detecting the stator inter-turn fault in an induction machine, in accordance with some embodiments of the present disclosure.

In an embodiment, the apparatus 103 may be any computing system, which may be configured to detect the stator inter-turn fault in the stator of the induction machine 101. In one embodiment, the apparatus 103 may be a condition monitoring device which is installed on the induction machine 101, or a computer/server located remote to the induction machine 101.

In an embodiment the apparatus 103 comprises an I/O Interface 201, a processor 203, a memory 200, data 204 and modules 210. The modules 210 further comprises a receiving module 218, a determining module 219, a generating module 220, and a detecting module 221 which will be explained in detail later.

In one embodiment, the processor of the apparatus 103 may be embodied as a multi-core processor, a single core processor, or a combination of one or more multi-core processors and one or more single core processors. For example, the processor of the apparatus 103 may be embodied as one or more of various processing devices, such as a coprocessor, a microprocessor, a controller, a digital signal processor (DSP), a processing circuitry with or without an accompanying DSP, or various other processing devices including, a microcontroller unit (MCU), a hardware accelerator, a special-purpose computer chip, or the like.

In an embodiment, the I/O interface module 201 of apparatus 103 may include, without limitation, enabling communication of the apparatus 103 with plurality of current sensors 102 and the display 105.

In an embodiment, the memory 200 is capable of storing machine executable instructions, referred to herein as instructions. In an embodiment, the processor 203 of the apparatus 103 is embodied as an executor of software instructions. As such, the processor 203 is capable of executing the instructions stored in the memory 200 to perform one or more operations described herein. The memory 200 can be any type of storage accessible to the processor 203 to perform respective functionalities.

In an embodiment, the data 204 further comprises the time series data 211, the first signature 212, the second signature 213, the first scaled signature 214, the second scaled signature 215 and other data 216 such as the UBF, discrimination factor etc.

In an embodiment, the I/O interface module 201 may include plurality of current sensors 102 connected to the stator of the induction machine 101 to receive the time series data 211 of stator current, by the processor 203 using the receiving module 218. In an embodiment, each of the plurality of current sensors 102 may measure one phase current of the stator. In an embodiment, the time series data measured may be analog signals and the plurality of current sensors 102 may digitize the analog signals. In an embodiment, a separate circuit may be implemented to digitize the analog signals.

Upon receiving the time series data 211 the processor 203 using the determining module 219 determines the first signature 212 in the time series data 211 using the fundamental components (Ia1, Ib1, Ic1) of the stator current. Upon determining the first signature 212, the processor 203 using the determining module 219 determines the second signature 213 in the time series data 211 using the third harmonic components (Ia3, Ib3, Ic3) of the stator current. The processor 203 using the generating module 220 generates the first scaled signature 214 and the second scaled signature 215 corresponding to the first signature 212 and the second signature 213 based on the UBF. Upon generating the first scaled signature 214, the processor 203 using the first scaled signature 214 and the second scaled signature 215 the processor 203 using the determining module 219 determines the discrimination factor, wherein the discrimination factor is the ratio of second scaled signature 215 and the first scaled signature 214. Finally, the processor 203 using the detecting module 221 detects the stator inter-turn fault when the discrimination factor is greater than a predetermined stator inter-turn fault threshold value.

In an embodiment, determining the first signature 212 in the time series data 211 of the stator current comprises: determining base factors (M1 and M2) of the first signature 212 by transforming the fundamental components (Ia1, Ib1, Ic1) of the stator current and then determining the first signature 212 in the time series data of the stator current using the base factors (M1 and M2). The fundamental components (Ia1, Ib1, Ic1) of the stator current are determined by subjecting the stator current through the fundamental transformation matrix calculations. The following mathematical equation is used to determine the first signature 212:

$$\text{first signature} = 2 * \frac{(|M_1| - |M_2|)}{(|M_1| + |M_2|)}$$

where $$\begin{bmatrix} M_1 \\ M_2 \end{bmatrix} = \left(\frac{2}{3}\right)\begin{bmatrix} 1 & -0.5 & -0.5 \\ 0 & -0.866 & 0.866 \end{bmatrix}\begin{bmatrix} I_{a1} \\ I_{b1} \\ I_{c1} \end{bmatrix}$$

In an embodiment, determining the second signature 213 in the time series data 211 of the stator current comprises: determining base factor (N1 and N2) of the second signature 213 by transforming the third harmonic components (Ia3, Ib3, Ic3) of the stator current and then determining the second signature 213 from the time series data of the stator current using the base factors (N1 and N2). The third harmonic components (Ia3, Ib3, Ic3) of the stator current are determined by subjecting the stator current through the third harmonic transformation matrix calculations. The following mathematical equation is used to determine the second signature 213:

$$\text{second signature} = 2 * \frac{(|N_1| - |N_2|)}{(|N_1| + |N_2|)}$$

where $$\begin{bmatrix} N_1 \\ N_2 \end{bmatrix} = \left(\frac{2}{3}\right)\begin{bmatrix} 1 & -0.5 & -0.5 \\ 0 & -0.866 & 0.866 \end{bmatrix}\begin{bmatrix} I_{a3} \\ I_{b3} \\ I_{c3} \end{bmatrix}$$

In an embodiment, upon determining the first signature 212 and the second signature 213 the processor 203 determines the first scaled signature 214 and the second scaled signature 215 corresponding to the first signature 212 and the second signature 213.

In an embodiment, the wave spectrum of the one or more faults in the first signature 212 are too cluttered and look similar to each other, this causes difficulty in differentiating the faults and to set a threshold values. In order to differentiate the faults and to set the respective threshold values the first signature 212 and the second signature 213 are scaled using the UBF, scaling the first signature 212 and the second signature 213 provides a better spread range of scale to differentiate the faults and to set respective threshold values. The following equation are used to determine the first scaled signature 214 and the second scaled signature 215:

First scaled signature =

$$\begin{cases} \dfrac{\text{first signature}}{UBF}, & \text{if } UBF > \text{first scaled signature thresold value} \\ \text{first signature}, & \text{if } UBF \le \text{first scaled signature threshold value} \end{cases}$$

second scaled signature =

$$\begin{cases} \dfrac{\text{second signature}}{UBF}, & \text{if } UBF > \text{second scaled signature threshold value} \\ \text{second signature}, & \text{if } UBF \le \text{second scaled signature threshold value} \end{cases}$$

In an embodiment, the UBF is the ratio of the negative sequence value and the positive sequence value of the stator current.

$$\text{Unbalance fator } (UBF) = \frac{\text{Negative sequence}}{\text{Positive sequence}}$$

In an embodiment, the disturbance is detected using following equation:

Disturbance detection: =

$$\begin{cases} \text{True,} & \text{if first scaled signature} > \text{disturbance thresold value} \\ \text{False,} & \text{if first scaled signature} \leq \text{disturbance threshold value} \end{cases}$$

In an embodiment, to discriminate the stator inter-turn fault from other faults the discrimination factor (DF) is determined whenever a disturbance is detected, where the discrimination factor is a ratio of the second scaled signature 215 and the first scaled signature 214. The mathematical equation to determine the discrimination factor is as follows:

$$\text{discrimination factor} = \frac{\text{Second signature}}{\text{First signature}}$$

In one embodiment, the present disclosure detects the stator inter-turn fault in the induction machine 101 using only one parameter of the induction machine 101 i.e., stator current. The present disclosure, when used to detect stator-inter turn in a 3-phase induction machine 101 the present disclosure may include, without limitation, receiving the time series data 211 of the stator currents of all the three phases using plurality of current sensors 102 connected to the stator of the induction machine 101. The following equation is used to detect the stator inter-turn fault in the induction machine 101:

stator inter turn fault =

$$\begin{cases} \text{True,} & \text{if discrimination factor} > \text{stator inter turn fault threshold value} \\ \text{False,} & \text{if discrimination factor} \leq \text{stator inter turn fault threshold value} \end{cases}$$

In an alternative embodiment, once the stator-inter turn fault is detected, the processor 203 further determines a severity of the stator inter-turn fault. The present disclosure determines the severity of the stator inter-turn using magnitude of the fundamental components (Ia1, Ib1, Ic1) of the stator current and magnitude of the base factors (N1 and N2) of the second signature 213. The following equation determines the severity of the stator inter-turn fault, when the stator inter-turn fault is detected:

$$\text{Stator inter turn fault severity} = 10 * \log\!\left(3 * \frac{|N_1| - |N_2|}{|I_{a1}| + |I_{b1}| + |I_{c1}|}\right)$$

In an embodiment, the present disclosure also determines a voltage unbalance in the power supply 104 of the induction machine 101. The voltage unbalance is determined when an Unbalance Factor Value (UBFVAL) is greater than a voltage unbalance threshold value. The UBFVAL is determined using the UBF.

Determining the voltage unbalance uses the following equation:

voltage unbalance =

$$\begin{cases} \text{True,} & \text{if } UBFVAL > \text{voltage unbalance threshold value} \\ \text{False,} & \text{if } UBFVAL \leq \text{voltage unbalance threshold value} \end{cases}$$

Where the UBFVAL is derived from UBF using following equation:

$$UBFVAL = \frac{UBF}{\sqrt{3} * 6}$$

In an embodiment, the present disclosure also determines a single phasing in the power supply 104 of the induction machine 101. The single phasing is determined when the UBF is greater than a single phasing threshold value. The following equation is used to determine the single phasing in the electrical supply of the induction machine 101;

$$\text{Single phasing} = \begin{cases} \text{True,} & \text{if } UBF > \text{single phaseing threshold value} \\ \text{False,} & \text{if } UBF \leq \text{single phasing threshold value} \end{cases}$$

FIGS. 3a and 3b is a graph illustrating phasors for stator current components (Ia, Ib, and Ic), base factors (M1 and M2) of first signature 212 and first signature 212 in an induction machine 101 under healthy and faulty condition, in accordance with some embodiments of the present disclosure.

In an embodiment, the graph as shown in FIGS. 3a and 3b illustrates the phasors for stator current components (Ia1, Ib1, and Ic1), base factors (M1 and M2) of first signature 212 and a disturbance based on the first signature 212 in the induction machine 101 under healthy and faulty condition in a practical situation. In FIG. 3a it can be noticed that in a practical induction machine 101 there exists a small amount of non-idealness i.e., the presence of disturbances as shown in the graph. This kind of unbalance inevitably creeps in during manufacturing process. In FIG. 3b it can be seen that disturbances are detected based on the first signature 212 under faulty condition, but the stator inter-turn fault cannot be uniquely identified/detected separately from the disturbances. The graph shown in FIGS. 3a and 3b is developed using only the first signature 212 i.e., the transformation of fundamental components (Ia1, Ib2, Ic3) of the stator current. Since it is difficult to uniquely identify the stator inter-turn fault from the disturbance using only fundamental components (Ia1, Ib2, Ic3) of the stator current the transformation of third harmonic components (Ia3, Ib3, Ic3) of the stator current is used to determine the second signature 213.

FIGS. 4a and 4b illustrates waveforms for healthy condition, voltage unbalance, broken rotor bar fault and stator-inter turn fault using first signature and first scaled signature respectively, from stator current of an induction machine, in accordance with some embodiments of the present disclosure.

In an embodiment, FIGS. 4a and 4b illustrates waveforms for stator-inter turn fault 401, voltage unbalance 402, broken rotor bar fault 403 and healthy condition 404 using first signature 212 from stator current of an induction machine 101. In FIG. 4a it can be seen that the wave forms show the signatures of one or more events such as stator inter-turn fault 401, voltage unbalance 402, broken rotor bar fault 403 and healthy condition 404, where it can also be seen that it becomes difficult to differentiate the stator inter-turn fault waveform 401 from the voltage unbalance waveform 402, the broken rotor bar fault waveform 403 from the healthy condition waveform 404 of the induction machine 101 due to which it becomes difficult to set the threshold value to detect the stator inter-turn fault in the induction machine 101. To overcome this condition the first signature 212 along and the second signature 213 is scaled using the UBF. The first scaled signature 214 gives a better ranging of scale among the events to set a stator inter-turn fault threshold value due to which the stator inter-turn fault can be differentiated and detected among the disturbances as shown in FIG. 4b. In FIG. 4b it can be seen that due to the better range of scale between the fault signatures in the wave form, differentiating of faults becomes easy as well as the threshold setting.

In an embodiment, the UBF is derived from the phase currents of the stator current as a ratio of the negative sequence current to the positive sequence current.

In an embodiment, the processor 203 after detecting the stator inter-turn fault in the induction machine determines the severity of the stator inter turn fault using the magnitudes of fundamental components of the stator current and the magnitudes of the base factor of second signature 213.

In an embodiment, after the processor 203 detects the stator-inter turn fault in the induction machine 101 or other faults such as voltage unbalance or single phasing in the power supply 104, the processor 203 displays the detection of such faults on the display 105.

In an embodiment, the first scaled signature 214 will also provide a sufficient scale range to set threshold values for one or more events such as voltage unbalance and signal phasing in the power supply 104 of the induction machine 101.

In an embodiment, a record of the waveforms may be stored in a storage unit and may be provided to the apparatus 203 periodically.

FIG. 5 shows a flowchart illustrating a method for detecting a stator inter-turn fault in an induction machine, in accordance with some embodiments of the present disclosure.

As illustrated in FIG. 5, the method 500 may include one or more blocks illustrating a method for detecting stator inter-turn fault in the induction machine 101. The order in which the method 500 is described is not intended to be constructed as a limitation, and any number of the described method blocks can be combined in any order to implement the method. Additionally, individual blocks may be deleted from the methods without departing from the scope of the subject matter described herein. Furthermore, the method can be implemented in any suitable hardware, software, firmware, or combination thereof.

At block 501, the method 500 includes receiving, by the processor 203, the time series data 211 of the stator current from the plurality of current sensors 102 connected to the stator of the induction machine 101.

At block 502, the method 500 includes determining, by the processor 203, the first signature 212 in a time series data 211 of the stator current using the fundamental components (Ia1, Ib1, Ic1) of the stator current.

In an embodiment, the fundamental component the (Ia1, Ib1, Ic1) of the stator current is derived by performing a fundamental transformation on the time series data 211 of the stator current.

At block 503, the method 500 includes determining, by the processor 203, the second signature 213 in a time series data 211 of the stator current using the third harmonic components (Ia3, Ib3, Ic3) of the stator current.

In an embodiment, the third harmonic components (Ia3, Ib3, Ic3) of the stator current is derived by performing a third harmonic transformation on time series data 211 of the stator current.

At block 504, the method 500 includes generating, by the processor 203, the first scaled signature 214 and the second scaled signature 215 corresponding to the first signature 212 and the second signature 213 respectively based on the UBF, wherein the UBF is the ratio of the negative sequence values and the positive sequence values of the stator current.

At block 505, the method 500 includes determining the discrimination factor using the first scaled signature 214 and the second scaled signature 215, wherein the discrimination factor is a ratio of the second scaled signature 215 and the first scaled signature 214.

At block 506, the method 500 includes detecting, by the processor 203, the stator inter-turn fault when the discrimination factor is greater than the stator inter-turn fault threshold value.

In an embodiment, the comparison between the discrimination factor and stator inter-turn fault is shown on the display 105 for easy identification of the stator inter-turn fault.

In an embodiment, the proposed method by overcoming the drawbacks of the conventional method detects the stator inter-turn fault in the induction machine 101 using only the current parameter of the induction machine 101. The method comprises determining the first signature 212 and the second signature 213 from the time series data 211 of stator current, the signatures are then scaled using Unbalance Factor (UBF) to get the better scale range to differentiate and set the thresholds for each fault in the induction machine 101. The method further comprises detecting other faults in the induction machine 101 along with determining the severity if the stator inter-turn fault.

An exemplary computer system will now be described. FIG. 6 illustrates an exemplary block diagram of a general-purpose computer system for detecting a stator inter-turn fault in an induction machine, in accordance with some embodiments of the present disclosure.

In an embodiment, the computer system 600 may be the apparatus 103 illustrated in FIG. 1, which provides the ability to generate a path to location of the source of the audio signal based on acoustic cues. The computer system 600 may include a Central Processing Unit ("CPU" or "processor") 602. The processor 602 may comprise at least one data processor for executing program components for executing user-or-system generated processes. The processor 602 may include specialized processing units such as integrated system (bus) controllers, memory management control units, floating point units, graphics processing units, digital signal processing units, etc.

The processor 602 may be disposed in communication with one or more Input/Output (I/O) devices (610 and 611) via I/O interface 601. The I/O interface 601 may employ communication protocols/methods such as, without limitation, audio, analogue, digital, stereo, IEEE®-1396, serial bus, Universal Serial Bus (USB), infrared, PS/2, BNC, coaxial, component, composite, Digital Visual Interface (DVI), high-definition multimedia interface (HDMI), Radio Frequency (RF) antennas, S-Video, Video Graphics Array (VGA), IEEE® 802.n/b/g/n/x, Bluetooth, cellular (e.g., Code-Division Multiple Access (CDMA), High-Speed Packet Access (HSPA+), Global System For Mobile Communications (GSM), Long-Term Evolution (LTE) or the like), etc. Using the I/O interface 601, the computer system 600 may communicate with one or more I/O devices 610 and 611.

In some embodiments, the processor 602 may be disposed in communication with a communication network 609 via network interface 603. The network interface 603 may communicate with the communication network 609. The network interface 603 may employ connection protocols including, without limitation, direct connect, Ethernet (e.g., twisted pair 10/100/1000 Base T), Transmission Control Protocol/Internet Protocol (TCP/IP), token ring IEEE® 802.11a/b/g/n/x, etc.

In an implementation, the communication network 609 may be implemented as one of the several types of networks, such as intranet or Local Area Network (LAN) and such within the organization. The communication network 609 may either be a dedicated network or a shared network, which represents an association of several types of networks that use a variety of protocols, for example, Hypertext Transfer Protocol (HTTP), Transmission Control Protocol/Internet Protocol (TCP/IP), Wireless Application Protocol (WAP), etc., to communicate with each other. Further, the communication network 609 may include a variety of network devices, including routers, bridges, servers, computing devices, storage devices, etc.

In some embodiments, the processor 602 may be disposed in communication with a memory 605 (e.g., RAM 613, ROM 616, etc. as shown in FIG. 6) via a storage interface 606. The storage interface 606 may connect to memory 605 including, without limitation, memory drives, removable disc drives, etc., employing connection protocols such as Serial Advanced Technology Attachment (SATA), Integrated Drive Electronics (IDE), IEEE-1394, Universal Serial Bus (USB), fiber channel, Small Computer Systems Interface (SCSI), etc. The memory drives may further include a drum, magnetic disc drive, magneto-optical drive, optical drive, Redundant Array of Independent Discs (RAID), solid-state memory devices, solid-state drives, etc.

The memory 605 may store a collection of program or database components, including, without limitation, user/application interface 606, an operating system 607, a web browser 609, and the like. In some embodiments, computer system 600 may store user/application data 606, such as the data, variables, records, etc. as described in this invention. Such databases may be implemented as fault-tolerant, scalable, secure databases such as distributed databases.

The operating system 607 may facilitate resource management and operation of the computer system 600. Examples of operating systems include, without limitation, APPLE® MACINTOSH® OS X®, UNIX®, UNIX-like system distributions (E.G., BERKELEY SOFTWARE DISTRIBUTION® (BSD), FREEBSD®, NETBSD®, OPENBSD, etc.), LINUX® DISTRIBUTIONS (E.G., RED HAT®, UBUNTU®, KUBUNTU®, etc.), IBM® OS/2®, MICROSOFT® WINDOWS® (XP®, VISTA®/7/8, 10 etc.), APPLE® IOS®, GOOGLE™ ANDROID™, BLACKBERRY® OS, or the like.

The user interface 606 may facilitate display, execution, interaction, manipulation, or operation of program components through textual or graphical facilities. For example, the user interface 606 may provide computer interaction interface elements on a display system operatively connected to the computer system 600, such as cursors, icons, check boxes, menus, scrolling tools, windows, widgets, and the like. Further, Graphical User Interfaces (GUIs) may be employed, including, without limitation, APPLE® MACINTOSH® operating systems' Aqua®, IBM® OS/2®, MICROSOFT® WINDOWS® (e.g., Aero, Metro, etc.), web interface libraries (e.g., ActiveX®, JAVA®, JAVASCRIPT®, AJAX, HTML, ADOBE® FLASH®, etc.), or the like.

The web browser 609 may be a hypertext viewing application. Secure web browsing may be provided using Secure Hypertext Transport Protocol (HTTPS), Secure Sockets Layer (SSL), Transport Layer Security (TLS), and the like. The web browsers 608 may utilize facilities such as AJAX, DHTML, ADOBE® FLASH®, JAVASCRIPT®, JAVA®, Application Programming Interfaces (APIs), and the like. Further, the computer system 600 may implement a mail server stored program component. The mail server may utilize facilities such as ASP, ACTIVEX®, ANSI® C++/C#, MICROSOFT®, .NET, CGI SCRIPTS, JAVA®, JAVASCRIPT®, PERL®, PHP, PYTHON®, WEBOBJECTS®, etc. The mail server may utilize communication protocols such as Internet Message Access Protocol (IMAP), Messaging Application Programming Interface (MAPI), MICROSOFT® exchange, Post Office Protocol (POP), Simple Mail Transfer Protocol (SMTP), or the like. In some embodiments, the computer system 600 may implement a mail client stored program component. The mail client may be a mail viewing application, such as APPLE® MAIL, MICROSOFT® ENTOURAGE®, MICROSOFT® OUTLOOK®, MOZILLA® THUNDERBIRD®, and the like.

Furthermore, one or more computer-readable storage media may be utilized in implementing embodiments consistent with the present invention. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., non-transitory. Examples include Random Access Memory (RAM) 613, Read-Only Memory (ROM) 616, volatile memory 605, nonvolatile memory, hard drives, Compact Disc (CD) ROMs, Digital Video Disc (DVDs), flash drives, disks, and any other known physical storage media.

In light of the technical advancements provided by the proposed method and the apparatus 103, the claimed steps, as discussed above, are not routine, conventional, or well-known aspects in the art, as the claimed steps provide the aforesaid solutions to the technical problems existing in the conventional technologies. Further, the claimed steps clearly bring an improvement in the functioning of the system itself, as the claimed steps provide a technical solution to a technical problem.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise. The terms "a", "an" and "the" mean "one or more", unless expressly specified otherwise.

A description of an embodiment with several components in communication with each other does not imply that all such components are required. On the contrary, a variety of optional components are described to illustrate the wide variety of possible embodiments of the invention.

When a single device or article is described herein, it will be clear that more than one device/article (whether they cooperate) may be used in place of a single device/article. Similarly, where more than one device/article is described herein (whether they cooperate), it will be clear that a single device/article may be used in place of the more than one device/article or a different number of devices/articles may be used instead of the shown number of devices or programs. The functionality and/or features of a device may be alternatively embodied by one or more other devices which are not explicitly described as having such functionality/features. Thus, other embodiments of invention need not include the device itself.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

LIST OF REFERENCE NUMBERS

| Reference Number | Description |
| --- | --- |
| 100 | Block Diagram arrangement |
| 101 | Induction machine |
| 102 | Plurality current sensors |
| 103 | Apparatus |
| 104 | Power supply |
| 105 | Display |
| 200 | Memory |
| 201 | I/O Interface |
| 203 | Processor |
| 204 | Data |
| 211 | Time series data |
| 212 | First signature |
| 213 | Second signature |
| 214 | First scaled signature |
| 215 | Second scaled signature |
| 216 | Other data |
| 218 | Receiving module |
| 219 | Determining module |
| 220 | Generating module |
| 221 | Detecting module |
| 600 | Computer system |
| 601 | Input/Output interface of the computer |
| 602 | Processor of the computer |
| 603 | Network interface |
| 604 | Storage interface |
| 605 | Memory of the computer |
| 606 | User/Application |
| 607 | Operating system |
| 608 | Web browser |
| 611 | Input devices |
| 612 | Output devices |
| 613 | Random access memory |
| 614 | Read only memory |

What is claimed is:

1. A method for detecting stator inter-turn fault in induction machines, the method comprising:
   operating an induction machine as a motor or a generator, the induction machine including a stator;
   coupling a plurality of current sensors to the stator and to a processor, the plurality of current sensors automatically converting measured analog currents to digital currents;
   receiving, by the processor, time series data of stator current measured by the plurality of current sensors connected to the stator of the induction machine;
   determining, by the processor, a first signature in the time series data of the stator current using fundamental components of the stator current;

determining, by the processor, a second signature in the time series data of the stator current using third harmonic components of the stator current;

generating, by the processor, a first scaled signature and a second scaled signature corresponding to the first signature and the second signature respectively based on an Unbalance Factor (UBF), wherein the UBF is a ratio of negative sequence values and positive sequence values of the stator current;

determining, by the processor, a discrimination factor using the first scaled signature and the second scaled signature, wherein the discrimination factor is a ratio of the second scaled signature and the first scaled signature; and detecting, by the processor, a stator inter-turn fault when the discrimination factor is greater than a stator inter-turn fault threshold value;

when a fault is determined to exist, taking an action, the action being one of issuing a warning or instructing that a maintenance operation be performed on the induction machine.

2. The method of claim 1, wherein determining the first signature comprises determining base factors of the first signature by transforming the fundamental components of the stator current.

3. The method of claim 2, wherein determining the first signature in the time series data of the stator current uses the base factors of the first signature.

4. The method of claim 1, wherein determining the second signature comprises determining base factors of the second signature by transforming the third harmonic components of the stator current.

5. The method of claim 4, wherein determining the second signature from the time series data of the stator current uses the base factors of the second signature.

6. The method of claim 1, wherein detecting the stator inter-turn fault comprises detecting, by the processor, a disturbance in the induction machine when the first scaled signature is greater than a disturbance threshold value, wherein the disturbance is indicative of a fault in the stator.

7. The method of claim 6, further comprising detecting, by the processor, the stator inter-turn fault based on the disturbance when the discrimination factor is greater than the stator inter-turn fault threshold value.

8. The method of claim 1, wherein generating the first scaled signature and the second scaled signature comprises generating the first scaled signature corresponding to the first signature, when the UBF is greater than a first scaled signature threshold value, and generating the second scaled signature corresponding to the second signature when the UBF is greater than a second scaled signature threshold value.

9. The method of claim 1, further comprising determining, by the processor, a severity of the stator inter-turn fault using a magnitude of fundamental components of the stator current and magnitude of the base factors of the second signature.

10. The method of claim 1, further comprising detecting, by the processor, voltage unbalance in a power supply of the induction machine when an Unbalance Factor Value (UBFVAL) is greater than a voltage unbalance threshold value, wherein UBFVAL is determined using the UBF.

11. The method of claim 1, further comprising detecting, by the processor, a single phasing in a power supply of the induction machine based on a disturbance when the UBF is greater than a single phasing threshold value.

12. An apparatus comprising:
an induction machine including a stator, the induction machine being operated as a generator or motor;
a plurality of current sensors coupled to the sensor, the plurality of current sensors automatically converting measured analog currents to digital currents;
a processor coupled to the current sensors and a memory coupled to the processor, wherein the processor is configured to:
receive time series data of stator current measured by a plurality of current sensors connected to a stator of an induction machine;
determine a first signature in the time series data of the stator current using fundamental components of the stator current;
determine a second signature in the time series data of the stator current using third harmonic components of the stator current;
determine a first scaled signature and a second scaled signature corresponding to the first signature and the second signature respectively based on an Unbalanced Factor (UBF), wherein the UBF is a ratio of negative sequence values and positive sequence values of the stator current;
determine a discrimination factor using the first scaled signature and the second signature, wherein the discrimination factor is a ratio of the second scaled signature and the first signature; and
detect a stator inter-turn fault when the discrimination factor is greater than a stator inter-turn fault threshold value;
when a fault is determined to exist, taking an action, the action being one of issuing a warning or instructing that a maintenance operation be performed on the induction machine.

13. The apparatus of claim 12, wherein the processor is configured to determine the first signature by determining base factors of the first signature by transforming the fundamental components of the stator current.

14. The apparatus of claim 13, wherein the processor is configured to determine the first signature in the time series data of the stator current using the base factors of the first signature.

15. The apparatus of claim 12, wherein the processor is configured to determine the second signature by determining base factors of the second signature by transforming the third harmonic components of the stator current, and determine the second signature from the time series data of the stator current using the base factors.

16. The apparatus of claim 12, wherein the processor is configured to detect the stator inter-turn fault by detecting a disturbance in the induction machine when the first scaled signature is greater than a disturbance threshold value, wherein the disturbance is indicative of a fault in the stator; and detect the stator inter-turn fault based on the disturbance when the discrimination factor is greater than the stator inter-turn fault threshold value.

17. The apparatus of claim 12, wherein the processor is configured to generate the first scaled signature and the second scaled signature, and wherein the processor is further configured to:
generate the first scaled signature corresponding to the first signature when the UBF is greater than a first scaled signature threshold value; and
generate the second scaled signature corresponding to the second signature when the UBF is greater than a second scaled signature threshold value.

18. The apparatus of claim 12, wherein the processor is further configured to determine a severity of the stator inter-turn fault using a magnitude of the fundamental components of the stator current and a magnitude of the base factors of the second signature.

19. The apparatus of claim 17, wherein the processor is further configured to detect a voltage unbalance in a power supply of the induction machine when an Unbalance Factor Value (UBFVAL) is greater than a voltage unbalance threshold value, and wherein UBFVAL is determined using the UBF.

20. The apparatus of claim 17, wherein the processor is further configured to detect a single phasing in a power supply of the induction machine based on a disturbance when the UBF is greater than a single phasing threshold value.

\* \* \* \* \*